(12) United States Patent
Macris

(10) Patent No.: US 6,686,532 B1
(45) Date of Patent: Feb. 3, 2004

(54) HEAT SINK/HEAT SPREADER STRUCTURES AND METHODS OF MANUFACTURE

(76) Inventor: Chris Macris, P.O. Box 2660, North Bend, WA (US) 98045

( * ) Notice: Subject to any disclaimer, the term of this patent is extended or adjusted under 35 U.S.C. 154(b) by 0 days.

(21) Appl. No.: 09/664,121

(22) Filed: Sep. 18, 2000

Related U.S. Application Data

(63) Continuation-in-part of application No. 09/535,931, filed on Mar. 24, 2000, now Pat. No. 6,297,441.

(51) Int. Cl.[7] .................. H01L 35/28; H01L 35/30; F25B 21/02
(52) U.S. Cl. .................. 136/204; 62/3.3; 257/930; 136/205
(58) Field of Search .................. 136/203, 204, 136/225; 62/3.2, 3.3; 257/930, 712, 713, 717, 718, 719, 722

(56) References Cited

U.S. PATENT DOCUMENTS

| | | | | |
|---|---|---|---|---|
| 3,097,027 A | * | 7/1963 | Mims et al. | 384/476 |
| 3,615,870 A | * | 10/1971 | Crouthamel | 136/204 |
| 3,635,037 A | * | 1/1972 | Hubert | 62/3.2 |
| 3,663,307 A | * | 5/1972 | Mole | 136/204 |
| 4,859,250 A | * | 8/1989 | Buist | 136/225 |
| 5,022,928 A | * | 6/1991 | Buist | 136/212 |
| 5,610,366 A | * | 3/1997 | Fleurial et al. | 136/202 |
| 5,724,818 A | * | 3/1998 | Iwata et al. | 62/3.7 |
| 6,384,312 B1 | * | 5/2002 | Ghoshal et al. | 136/203 |

* cited by examiner

Primary Examiner—Patrick Ryan
Assistant Examiner—Thomas H. Parsons
(74) Attorney, Agent, or Firm—Jensen & Puntigam, PS

(57) ABSTRACT

A heat sink/heat spreader structure utilizing thermoelectric effects to efficiently transport thermal energy from a variety of heat sources including integrated circuits and other electronic components. A method for manufacturing the heat sink/spreader is also disclosed.

27 Claims, 20 Drawing Sheets

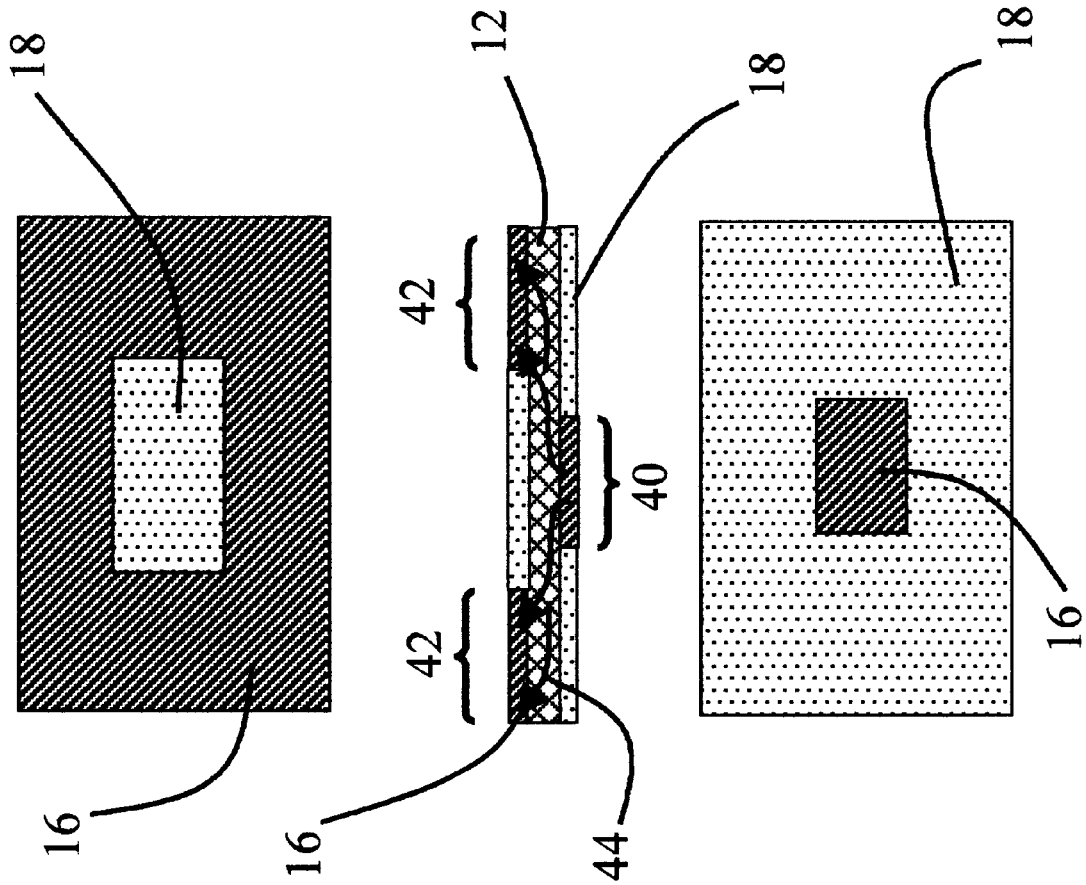

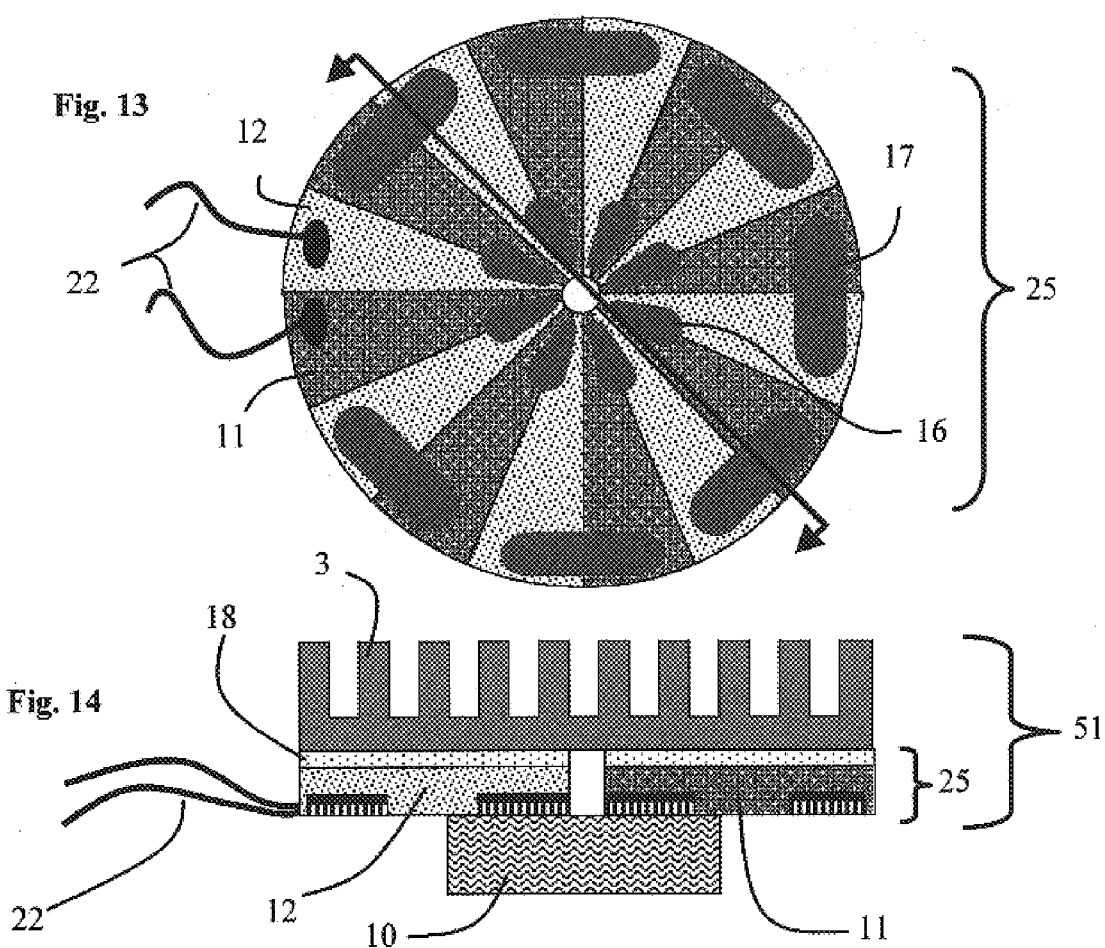

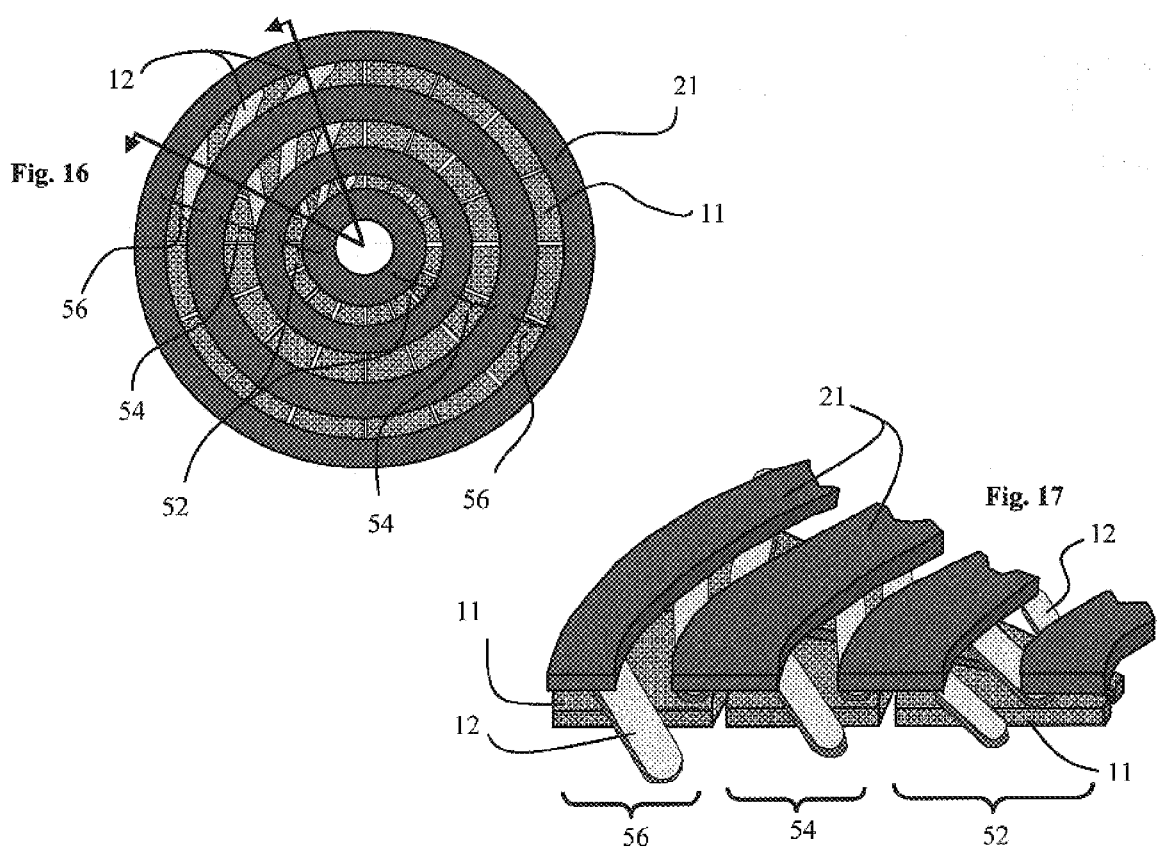

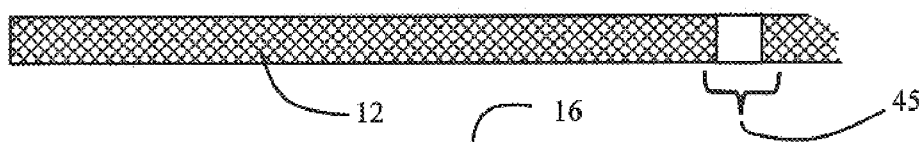
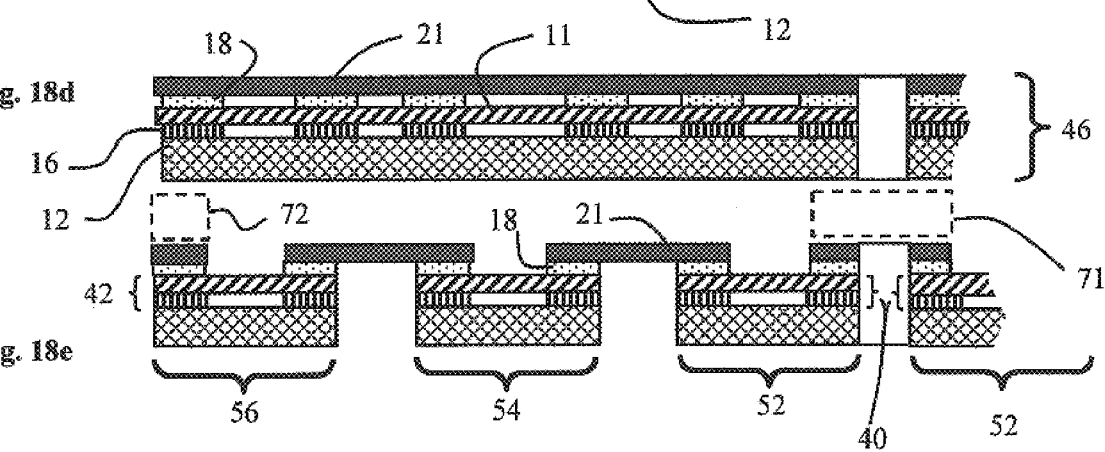
Fig. 18a
Fig. 18b
Fig. 18c
Fig. 18d
Fig. 18e

HEAT SINK/HEAT SPREADER STRUCTURES AND METHODS OF MANUFACTURE

CROSS-REFERENCE TO RELATED APPLICATIONS

The present application is a continuation-in-part of, and claims priority from, application Ser. No. 09/535,931 filed Mar. 24, 2000, now U.S. Pat. No. 6,297,441.

FIELD OF THE INVENTION

This invention relates to the field of heat sink and heat spreader structures and, more particularly, to heat sink/spreader structures which utilize thermoelectric effects to more efficiently dissipate thermal energy from heat sources including electronic devices and circuits.

BACKGROUND

The performance levels of microelectronic devices (e.g., integrated circuits, power amplifiers) are continually increasing to keep pace with the demands of modem technology. Performance levels such as clock speed are closely tied to the number and density of features (e.g., transistors) patterned onto the microelectronic device. Faster processing by the microelectronic device demands faster clock speeds. Faster clock speeds, in turn, mean more switching and power dissipation per unit time.

Sub-micron transistors and other features are currently patterned onto silicon wafers with extremely high densities. For example, several million transistors can be patterned on a single square centimeter of silicon. Switching speeds as fast as a few nanoseconds can be achieved with each transistor.

In theory, the performance levels of microelectronic devices should continually improve as the size of the transistors is decreased and the density of the features is increased. In practice, however, small, closely packed features dissipate large amounts of heat which limit performance levels. Heat is often dissipated from small, select regions of the device typically by heat sinks.

Temperature control has thus emerged as the limiting factor in the design of microelectronic devices. New-age devices, such as high-power amplifiers and multi-chip modules, radiate particularly large amounts of heat. Failure to effectively conduct away heat leaves these devices at high operating temperatures, ultimately resulting in decreased performance and reliability.

Heat sinks are most efficient when there is a uniform heat flux applied over the entire base. "Spreading resistance" occurs when a heat sink with a large base-plate area is attached to a heat source of a smaller footprint area. This results in a higher local temperature at the location where the heat source is placed. The spreading resistance is directly influenced by the following variables:

Footprint or contact area of the heat source;
Footprint area of the heat sink base-plate;
Thickness of the heat sink base-plate;
Thermal conductivity of the heat sink base-plate;
Average heat sink thermal resistance;
Location of the heat source relative to the base-plate center point.

The typical approach to overcoming spreading resistance is to increase the size of the heat sink, increase the thickness of the base, increase the airflow across the heat sink, or decrease the incoming air temperature. These steps increase weight, noise, system complexity and expense. When a solution cannot be achieved, the impact can be lost profits due to reduced electronics' performance, decreased reliability due to high operating temperatures increased fan speeds and delays in new product introductions while thermal issues are resolved.

To improve the thermal performance of an electronics or integrated circuit package, heat sinks and heat spreaders are added either internally or externally to the packages. However, the typical materials utilized exhibit a variety of shortcomings including: thermal expansion mismatch between the heat spreader and the chip, excessive weight, high cost and marginal thermal performance.

Furthermore, these electronic/integrated circuit devices have enhanced performance when operated at lower temperatures. For example, CMOS logic devices operating at −50 degrees Celsius possesses a 50% performance improvement over room temperature operation. Additionally, the integrated circuit wiring resistance is decreased by a factor of two also at −50 degrees Celsius. A popular method of cooling includes the use of multistage thermoelectric devices. However, the high cost of these devices has prevented any commercially viable products from taking advantage of these performance improvements.

U.S. Pat. No. 5,229,327, granted to Farnworth on Jul. 20, 1993 discloses structures to cool semiconductor devices with Peltier junctions. Electric current is passed through the Peltier junctions and semiconductor device (both in series) via a heat sink acting as a electrical bus and mechanical support. In addition, layers of metal and semiconductor material are progressively layered upon a semiconductor die (over a passivated layer) and junctions formed to yield peltier cooling. Power to the Peltier junctions (positive and negative terminals) is provided through the semiconductor die.

U.S. Pat. No. 5,637,921, granted to Burward-Hoy on Jun. 10, 1997 relates to a cooled electronic component package in which a single or multistage thermoelectric device contacts an integrated circuit chip via a cold plate. The chip and thermoelectric device are located within a sealed component package cavity in order to cool the chip to sub-ambient temperatures without condensation.

U.S. Pat. No. 5,714,791, granted to Chi, et al. on Feb. 3, 1998 discloses a micromachined Peltier device in which a silicon substrate is doped from one face to yield thin P and N-type thermoelements on top of a thin silicon membrane. The cold junctions of the thermoelements are located above a cavity (aperture) to minimize thermal conduction through the silicon substrate.

U.S. Pat. No. 6,196,002, granted to Newman, et al. on Mar. 6, 2001 relates to a ball grid array (BGA) integrated circuit package containing a thermoelectric device A cooling the IC chip. Power for the thermoelectric cooler is supplied by the BGA package via conductive contacts. The thermoelectric cooler is positioned partially within the package substrate and one face (which contacts the IC chip) is cooler than the opposite thermoelectric face.

U.S. Pat. No. 5,569,950, granted to Lewis, et al. on Oct. 29, 1996 relates to a device to monitor and control the temperature of IC chips with a thermoelectric cooler and thermocouple sensing. A thermocouple, placed between the chip and thermoelectric cooler, provides feedback to regulate power to the cooler.

U.S. Pat. No. 5,598,031, granted to Groover, et al. on Jan. 28, 1997 discloses an IC package whereby the IC chip is mounted to a separate silicon substrate (larger in surface area than chip) in order to provide heat spreading via thermal conduction. Additionally, electrical pads and circuit traces are disposed onto the substrate surface (over an oxide layer) in order to provide electrical connection between the IC chip and package.

U.S. Pat. No. 5,837,929, granted to Adelman on Nov. 17, 1998 discloses a thermoelectric device and fabrication method in which a doped semiconducting substrate contains oppositely doped regions thereby creating positive and negative type thermoelements. These vertically oriented thermoelements are electrically isolated by etching spaces and filling the spaces with a polyimide material.

U.S. Pat. No. 4,211,888, granted to Stein, et al. on Jul. 8, 1980 relates to a thermopile in a star-like pattern on top of a semiconductor substrate. One thermoelement type is formed by doping regions on the substrate and the dissimilar thermoelement type is a metal layer deposited over an oxide. The center junctions of the thermopile are heated by a source of thermal radiation to be measured.

U.S. Pat. No. 5,956,569, granted to Shiu, et al. on Sep. 21, 1999 relates to a thermoelectric cooler structure and fabrication method in which the cooler is formed on the backside of a semiconductor substrate. The thermoelements, perpendicularly oriented to the substrate, are fabricated by etching the substrate, depositing doped polysilicon layers, oxide insulating layers and metal contact layers.

U.S. Pat. No. 4,646,126, granted to Iizuka on Feb. 24, 1987 relates to a multiple IC chips mounted to a separate silicon substrate (via an oxide layer) and wiring layers interconnecting them.

U.S. Pat. Nos. 5,777,385 and 6,162,659, granted to Wu on Jul. 7, 1998 and Dec. 19, 2000 respectively disclose an electronic package structure in which a silicon heat spreader substrate is bonded to the backside to an IC chip via discrete, raised solder joints.

U.S. Pat. No. 5,032,897, granted to Mansuria, et al. on Jul. 16, 1991 discloses an integrated circuit package in which the IC chip is bonded to a thermoelectric cooler (thermoelements oriented perpendicular to the IC chip) and positioned within the package cavity.

U.S. Pat. No. 6,222,113, granted to Ghoshal on Apr. 24, 2001 relates to a thermoelectric cooler whose thermocouples are mounted to a doped semiconducting substrate with discrete conductive regions corresponding to each electrical interconnection member connecting both thermoelement types. Power is thereby supplied to the thermoelectric cooler's thermocouples (mounted between the two substrates) via both substrates.

U.S. Pat. No. 6,094,919, granted to Bhatia on Aug. 1, 2000 relates to an IC package whose lid contains an integrated thermoelectric cooler comprising thermoelements oriented perpendicularly to the lid and IC chip.

U.S. Pat. No. 5,061,987, granted to Hsia on Oct. 29, 1991 discloses an electronic package comprising a silicon substrate to which an IC chip is bonded. Electrical pads and circuit traces are disposed to the faces of the substrate and conductive vias are formed (through doping) to electrically connect both substrate faces. Additionally, a silicon cover is hermetically sealed to the substrate.

U.S. Pat. No. 4,092,614, granted to Sakuma, et al. on May 30, 1978 discloses a semiconductor laser in which a silicon crystal body is sandwiched between a metal body and semiconductor laser crystal body thereby providing an thermal and electrical path through the entire sandwich.

U.S. Pat. No. 6,091,142, granted to Lee on Jul. 18, 2000 relates to a stacked semiconductor package in which multiple IC chips are mounted between and supported by becker and cap structures. Additionally, one heat sink is mounted to the wire bond pads and another is mounted under each chip, thereby requiring at least one heat sink per IC chip. Both heat sinks protrude from the becker and cap to radiate heat.

U.S. Pat. No. 5,051,865, granted to Kato on Sep. 24, 1991 discloses a stacked semiconductor structure in which a plurality of chip sets (each comprised of a heat plate sandwiched by two IC chips) are bonded and electrically interconnected. Bonding between chip and heat sink is accomplished through conductive paste or solder in order for electrical power to be transferred between components.

U.S. Pat. No. 4,698,662, granted to Young, et al. on Oct. 6, 1987 relates to a multichip module is which IC chips are dielectrically bonded to a silicon substrate which, in turn, is dielectrically bonded to a heat sink. Electrical conductive traces are deposited onto the substrate's surface to provide electrical connection between the chips and package pins.

Now, the field of Thermoelectricity relates to the thermodynamic effects of temperature differentials, electric potential gradients and current flow in single and multiple dissimilar electrical conductors or semiconductors. There are basically three effects which comprise this field including: the Seebeck Effect, the Peltier Effect and the Thomson Effect.

In 1821, Seebeck found that when two dissimilar conducting or semiconducting materials are joined to each other at both ends and if there is a temperature differential between these two ends, an EMF, or voltage, will be established within the two materials. This effect is called the Seebeck Effect. The effect arises because the presence of a temperature gradient in a material causes a carrier-concentration gradient and an electric field established which causes the net flow of charge carriers when the conductors are joined into a closed electrical circuit.

In 1834, Peltier observed that heat was either liberated or absorbed at the junction of two dissimilar conductors or semiconductors when an electric current was passed through the junction. Measurements established that the rate of absorption or liberation of heat at the junction was directly proportional to the electric current. The effect arises because the potential energy of the charge carriers is in general different in the two conductors and also because the scattering mechanisms that govern the equilibrium between the charge carriers and the crystal lattice differ in the two conductors. Therefore, in order to maintain a conservation of energy as well as a conservation of charge when charge carriers move across the junction, energy must be interchanged with the surroundings of the junction. As in the case of the Seebect Effect, the Peltier Effect cannot be ascribed to either material alone but rather is a consequence of the junction.

In 1857, Thomson found that an energy interchange with the surroundings took place throughout the bulk of a conductor if an electric current was allowed to flow while a temperature gradient existed in the conductor. The rate of energy absorbed or liberated per unit length was proportional to the product of the electric current and the temperature gradient. The reasons for the existence of the Thomson Effect are essentially the same as those that cause the Peltier Effect. However, the difference in the potential energy of the charge carriers and in the scattering mechanisms are the consequences of the temperature gradient and not of the inhomogeneities in the conductor.

Additionally, charge carriers which flow (induced by a voltage) from one region of any conductive or semiconductive material to another carry with them small quantities of heat energy. If the carriers originally at one temperature in the conductor are displaced to cooler surroundings, they must discharge their excess kinetic energy by collisions with the lattice, thereby maintaining a conservation of energy. This process assists the normal thermal conduction of heat energy in the conductor, which would occur in the absence of charge carrier (electric current) flow.

By combining the electric charge induced (active) heat transfer mechanisms created by the thermoelectric effects with the thermal conduction/radiation (passive) heat transfer mechanisms of typical heat sink/heat spreader structures, a more effective heat management structure is produced.

SUMMARY OF THE INVENTION

Accordingly, it is the overall object of the present invention to develop and construct heat sink/heat spreader structures, which utilize thermoelectric effects in order to more effectively transfer thermal energy from various sources including electronic components. More effective heat dissipation results in thinner, smaller volume and lower cost heat sinking structures.

It is an object of the present invention to provide a heat sink/spreader structure in which the structure itself is a thermoelectric couple, which may have an external electric potential applied.

An additional object of the present invention provides a heat sink/spreader structure comprising a thermoelectric couple with elements connected together at both ends. When subjected to a temperature gradient, an EMF and corresponding current is established within the couple resulting in the absorption and liberation of heat at these junctions without the need for external electrical power.

Another object of the present invention is to provide a heat sink/heat spreader structure, comprising of simply an electrically conductive heat sink, wherein the heat sink has an external electric potential applied in order to induce a Thomson Effect and resulting heat transfer through the structure.

Another object of the present invention is to have thermoelectric couples of the heat sink/spreader structure electrical in series with an external electric load such as an electronic component or other thermoelectric device.

Yet, another object of the present invention is to fabricate a heat sink/spreader structure comprising a single thermoelectric couple constructed of one metallic thermoelement and one semiconductor thermoelement.

Still another object of the present invention is to provide optimal materials and thermal values for the thermoelements comprising the heat sink/heat spreader structure.

One additional object of the present invention is to have material exhibiting thermoelectric properties embedded into the heat sink material to create and utilize thermoelectric effects for the transfer of thermal energy.

Another object of the present invention is to provide a heat sink/spreader structure comprised of multiple thermoelectric couples, in a planar configuration, combined with a heat sink.

One further object of the present invention is to provide a multistage "planar" thermoelectric device structure, wherein each successive stage is added to the horizontal plane. The heat absorbing junctions of the stage interfacing the heat source are located in the center of the structure and the heat rejecting junctions of the heat rejecting stage are located within the perimeter of the structure.

One object of the present invention is to provide heat sink/spreader structures which are integrated with the packaging of electronic components such as integrated circuits to more effectively remove heat. An additional object is to reduce the coefficient of thermal expansion mismatch between integrated heat spreaders of the prior art and the circuitry.

Again, another object of the present invention is to demonstrate economical methods of manufacturing the heat sink/spreader structures disclosed.

It is an object of the present invention to provide an electronics or integrated circuit package which incorporates a heat spreader/heat sink structure being lightweight and low cost while exhibiting high thermal performance.

It is another object of the present invention to provide a multistage thermoelectric device to cool electronic circuits economically in order to raise their operating performance.

Lastly, it is an object of the present invention is to combine all of these unique design aspects and individual fabrication techniques into effective heat sink/spreader structures.

BRIEF DESCRIPTION OF THE DRAWINGS

FIGS. 5a through 5c illustrate the conductive and dielectric layers in a heat sink/spreader of the present invention.

FIG. 13 is a plan view of a thermoelectric-based heat spreader comprising multiple thermoelectric couples (electrically in series) wherein the heat absorbing interconnection members are near the center of the structure and the heat rejecting members are located near the perimeter.

FIG. 14, a sectional view of the heat spreader structure of FIG. 13, illustrates the embedding of the heat absorbing and heat rejecting interconnection members within the thermoelements comprising the thermocouples.

FIG. 16 is a plan view illustrating a multistage cascaded version of a single stage thermoelectric device seen in FIGS. 15a through 15e.

FIG. 17 is an isometric view of the structure seen in FIG. 16.

FIGS. 18a through 18e illustrate the fabrication of a multistage cascaded thermoelectric device seen in FIGS. 16 and 17.

DETAILED DESCRIPTION OF THE INVENTION

Described below are several embodiments of the present invention which illustrate various ways the present invention can be implemented. In the descriptions that follow, like numerals represent like elements in all figures. For example, where the numeral 10 is used to refer to a particular element in one figure, the numeral 10 appearing in any other figure refers to the same element.

Figure 1:
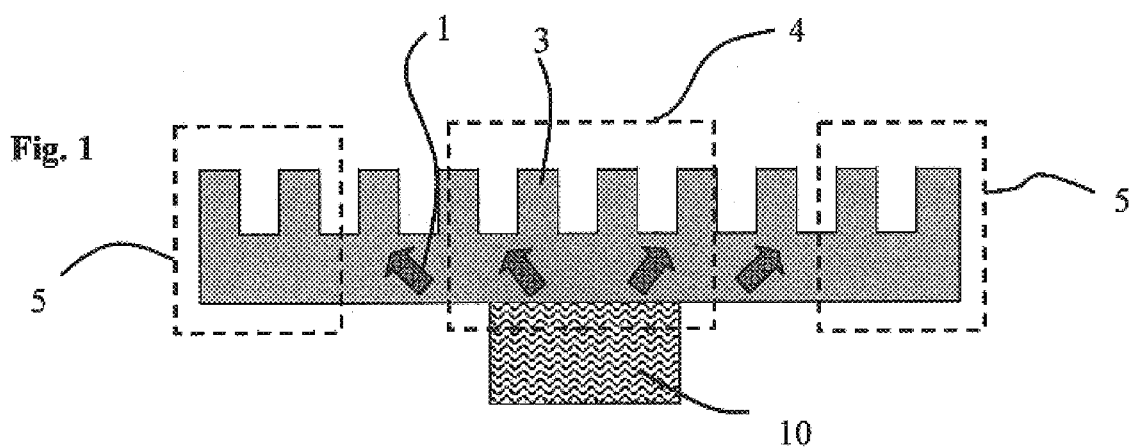
FIG. 1 is a pictorial representation illustrating conductive heat flow paths in a typical heat sink when interfaced with a heat source.

As seen in FIG. 1, a heat source 10 is coupled to a heat sink 3 in a typical application to dissipate excess thermal energy. Due to the further densification of electronic device packages, the heat sink must be significantly larger in length and width than that of the heat source in order to dissipate enough heat per given time. As thermally conducted heat 1 moves outward from the source 10 and through the heat sink 3, the perimeter regions 5 do not receive as much heat as the center region 4 immediately adjacent the heat source 10. As a result, thermal spreading resistance becomes a major limiting factor in the heat sink's ability to dissipate heat to the surrounding ambient.

Figure 2:
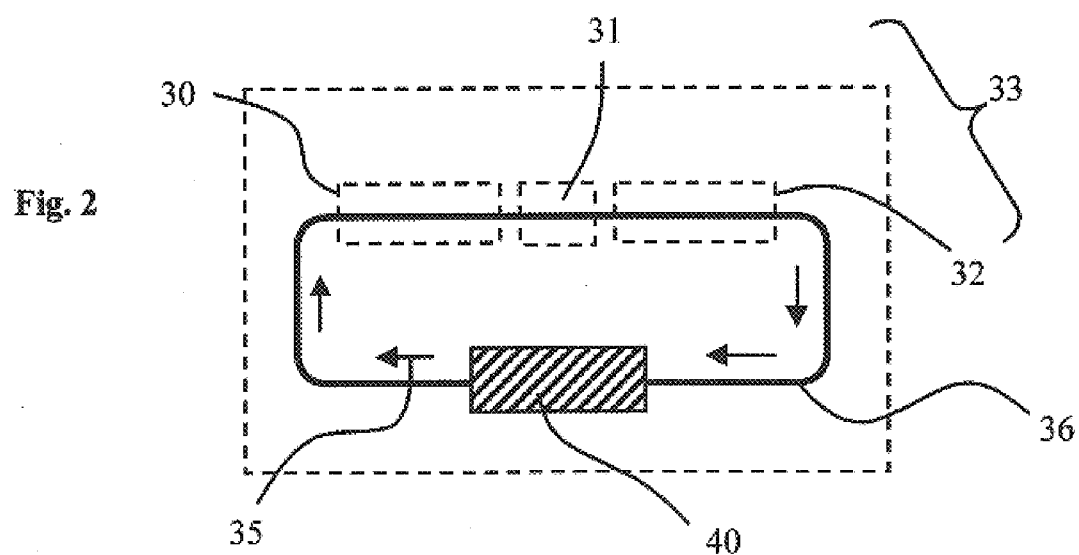
FIG. 2 illustrates how one of the thermoelectric effects (Thomson Effect) functions.

FIG. 2 schematically illustrates how one thermoelectric effect, the Thomson Effect, operates when a temperature gradient is established in an electrical conductor which is carrying an electric current.

Theoretically speaking, the charge carriers (electrons or holes) at one temperature have a very different average energy from the same charge carriers in the same conductor, but at a different temperature. This average energy is maintained through frequent collisions with the crystal lattice. If the average energy of the arriving charge carriers is lower, they absorb energy along the path through frequent collisions with the crystal lattice, which in turn absorbs energy from the surroundings. The flow of energy is reversed if the average energy of the arriving charge carriers is higher.

Practically speaking, a current source 40 is electrically connected to a conductor 36 and charge carriers flow in a particular direction 35. Assuming the entire conductor 36 is held at a temperature 33 different from that of one warmer spot 31, the heat absorbing effect will create a cooling region 30 and the reverse effect, or heat liberation will create a heating region 32. Thus, heat energy will be pumped from the cooling region 30 and dumped to the heating region 32 to be exchanged with the surroundings.

Figure 3:
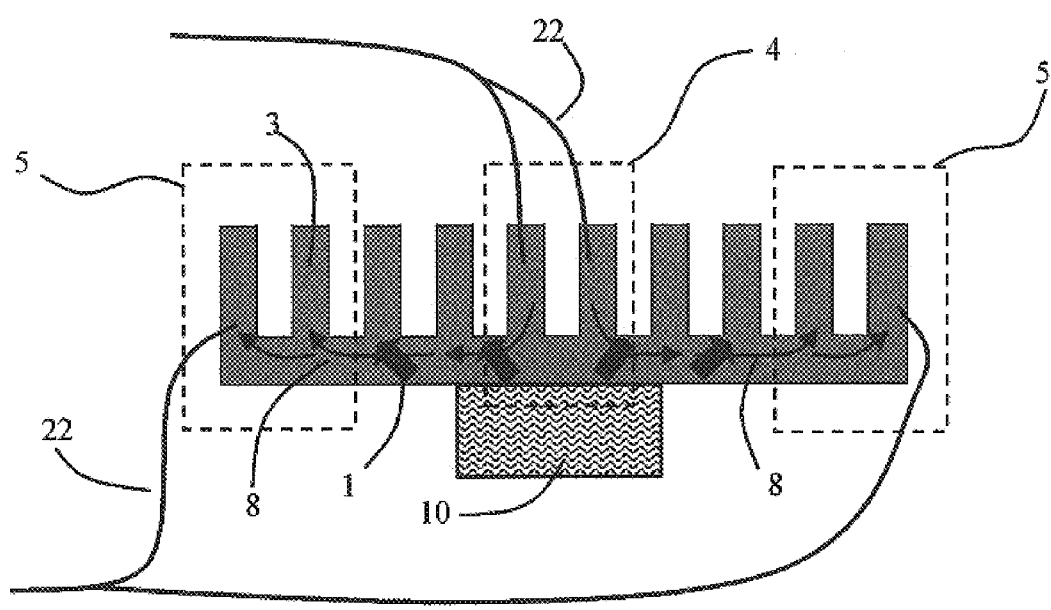
FIG. 3 illustrates the utilization of the Thomson Effect in the present invention.

As shown in FIG. 3, the Thomson effect is applied to a practical application. Given the example of FIG. 1, a heat source 10, coupled to a heat sink 3, again has a center region 4, which receives most of the thermally conducted heat 1. In this example, however, an electric potential (voltage) 22 is applied across the heat sink 3 and charge carrier flow 8 (flowing perpendicular to the heat source and heat sink axis) absorbs heat energy from the center region 4 and dissipates more heat to the perimeter regions 5, resulting in higher heat sink efficiency. Additionally, any conductor or semiconducting material can be placed between the heat source 10 and the heat sink 3 which, when a voltage is applied, can induce the Thomson Effect of heat transport.

In one embodiment of the present invention, a heat sink is constructed of metallic fins, which are electrically bonded to a semiconductor base plate. The fins and base plate are each one thermoelement of a thermoelectric couple which has a voltage applied.

FIGS. 4a through 4d demonstrate the process flow for the fabrication of a heat sink/spreader structure, which utilizes another thermoelectric effect, the Peltier Effect, to remove thermal energy more efficiently. In this embodiment, a heat sink 3 and thermoelement material 12 are each thermoelements comprising one thermoelectric couple.

Figure 4A:
FIGS. 4a through 4d illustrate one method for fabricating a heat sink/spreader structure utilizing thermoelectric effects.

As shown in FIG. 4a, a thermoelement material 12, conductor or semiconductor, is provided in sheet form. Preferable semiconducting materials include: Silicon, Carbon (fiber or graphite) and Silicon Carbide. It has been found that Silicon of P-type conductivity and of a purity less than or equal to 99.5% possesses good performance and is quite economical. Additionally, optimal thermoelement materials possess a Thermal Conductivity value of greater than 0.25 watts/cm per degree Celsius in order for passive thermal conduction to significantly contribute to overall heat transport.

Figure 4B:
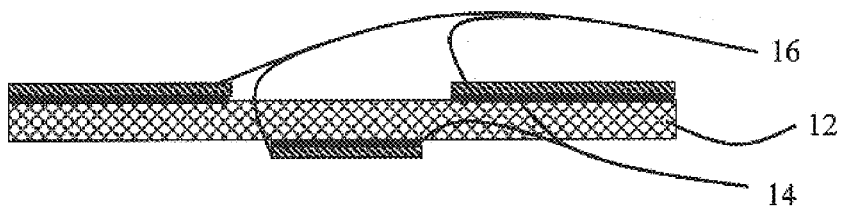

As seen in FIG. 4b, the Silicon 12 is selectively metallized 14 in order to accept a conductive bonding layer 16. Metallization processes include: a molten or semi-molten spraying process such as plasma or flame spraying, electroless or electroplating, thermal evaporation or sputtering. Conductive bonding and metallizing can be combined by utilizing: welding, brazing, soldering, diffusion bonding or electrically conductive adhesive.

Figure 4C:
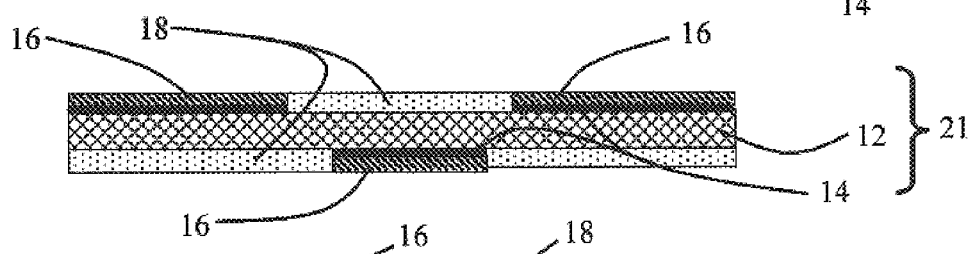
Figure 4D:
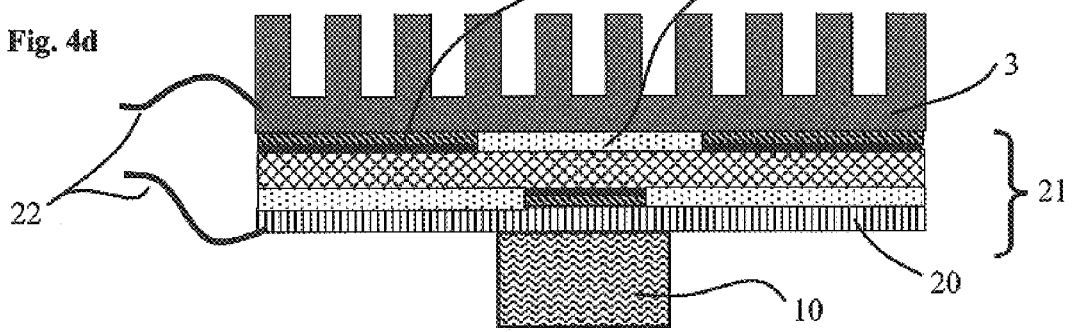

FIG. 4c makes reference to a thermally conductive dielectric layer 18 thermally in parallel with the electrically conductive bonding layer 16 disposed between the Silicon 12 and the heat sink 3 (a metallic composition) and metallic sheet 20 of FIG. 4d.

Reference is now made to FIG. 4d wherein the thermoelement composite structure 21 of FIG. 4c is bonded to the heat sink 3 thorough the electrically conductive layers 16 and through a dielectric layer 18. This heat sink 3 is, therefore, bonded along the entire leg length of the dissimilar thermoelement 12, including all electrically conductive bonding layers 16, which comprise the heat absorbing and heat rejecting junctions. The opposite face of the composite 21 is also selectively bonded (electrically and dielectrically)

to a metallic sheet 20. A voltage 22 is applied to the heat sink 3 and metallic sheet 20, causing a current flow through the entire structure. The structure is coupled to a heat source to begin removing the excess thermal energy. The complete structure possesses a thermoelement leg length axis which is perpendicular to the heat sink and heat source axis, enabling lateral thermal transport.

FIGS. 5a through 5c demonstrate how, through selective conductive and dielectric layering, dissimilar conductor junctions are created resulting in a thermoelectric couple used to remove heat energy from a source.

In FIG. 5b, the sectional view discloses electrically conductive bonding layers 16 and dielectric layers 18 are disposed onto the Silicon thermoelement material 12.

FIG. 5a, a plan view of the composite face which is bonded to the heat sink 3 of FIG. 4d, illustrates how the dielectric layer 18 is disposed near the center of the composite face and the electrically conductive bonding layer 16 is disposed near the composite face perimeter.

FIG. 5c is a plan view of the composite face opposite that in seen in FIG. 5a. This face is coupled to a heat source 10 seen in FIG. 4d. Here, the electrically conductive bonding layer 16 is disposed near the center and the dielectric layer 18 is located near the composite face perimeter.

Again, as seen in FIG. 5b, the electrically conductive bonding layers 16, create one dissimilar conductor junction 42 when bonded to the conductive heat sink 3 of FIG. 4d. Likewise, the electrically conductive bonding layer 16, which is bonded to the metallic sheet 20 in FIG. 4d, creates another dissimilar conductor junction 40.

Now, according to the Peltier Effect, when a voltage and corresponding current flows across two junctions formed by two dissimilar conductors, heat energy will be absorbed at one junction and liberated at the second junction. In the examples of the present invention, the electric voltage polarity is applied to yield an absorption of heat energy at the junction 40 which is coupled to the heat source 10 and that energy is liberated at the junctions 42 which are bonded to the heat sink 3. The corresponding transport of heat energy is via a thermoelectric phenomena, seen as the "entropy of transport" 44.

The Peltier Effect can also be created by simply creating an electrical junction between two dissimilar electrically conductive heat sinks and applying a voltage across the structure.

Figure 6:
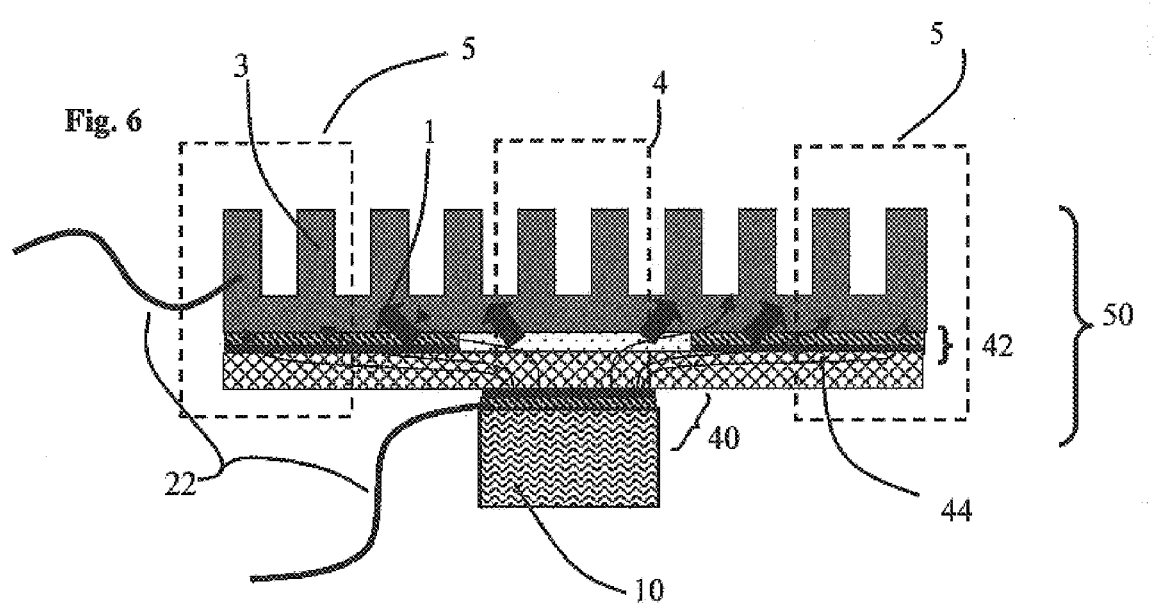
FIG. 6 illustrates another heat sink/spreader structure embodiment with conductive and thermoelectric heat flow paths.

Within FIG. 6, it can be seen that the passive thermal conduction 1 continues to flow (in a parallel and perpendicular vector through the thermoelement legs) into the center region 4 of the heat sink 3. However, heat transfer via entropy of transport 44 flows parallel through the thermoelement legs (perpendicular to the heat sink and heat source axis) from the heat absorbing junction 40 to the heat liberating, or rejecting, junctions 42 when a voltage 22 is applied across the heat sink/spreader structure 50. This combination of thermal transport mechanisms create a more efficient heat sink/heat spreader structure.

Figure 7:
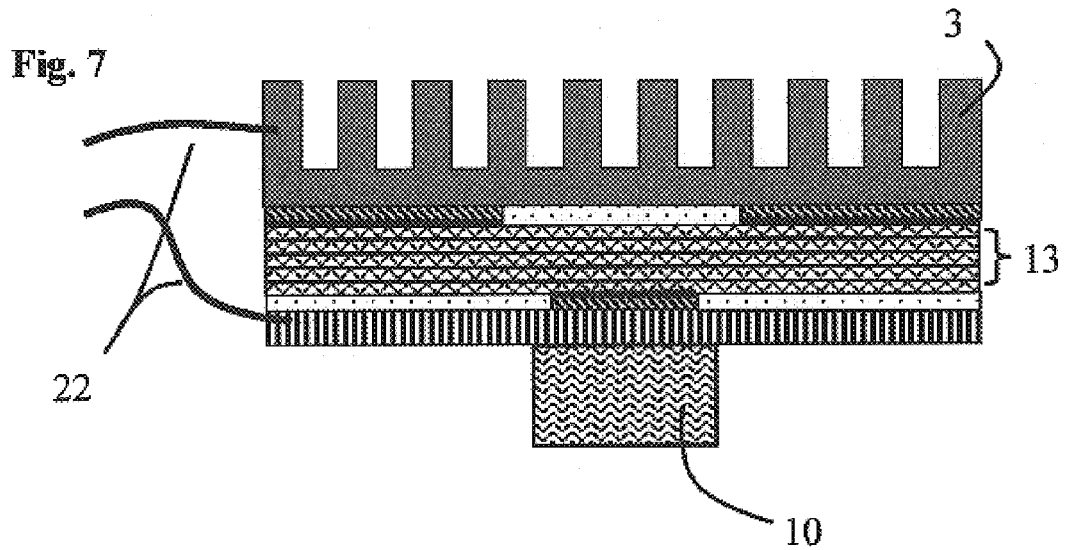
FIG. 7 illustrates yet another heat sink/spreader structure embodiment utilizing multiple thermoelement layers.

FIG. 7 illustrates one embodiment of a heat sink/spreader structure in which the semiconducting thermoelement material 12 of the previous figures is now layered with many dielectric layers, perhaps the oxides of the semiconductor itself. This multi-layered thermoelement 13 creates resistance to passive thermal conduction, yet allows entropy of transport to still occur through the action of tunneling.

Figure 8:
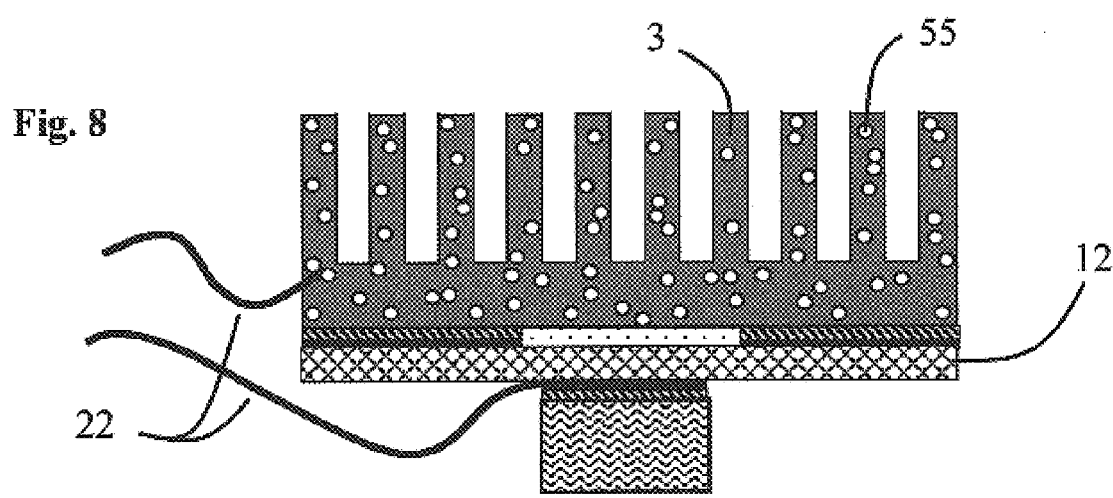
FIG. 8 illustrates a heat sink/spreader structure in which conductive material is mixed with the heat sink to induce additional thermoelectric effects.

In FIG. 8, another embodiment of a heat sink/spreader structure is disclosed. It includes a metallic-based heat sink with a mixture of dissimilar particles 55 exhibiting a higher thermoelectric power, or Seebeck Effect, in order to increase the thermoelectric efficiency of the heat sink 3 as a thermoelement when combined with the dissimilar thermoelement 12.

Figure 9:
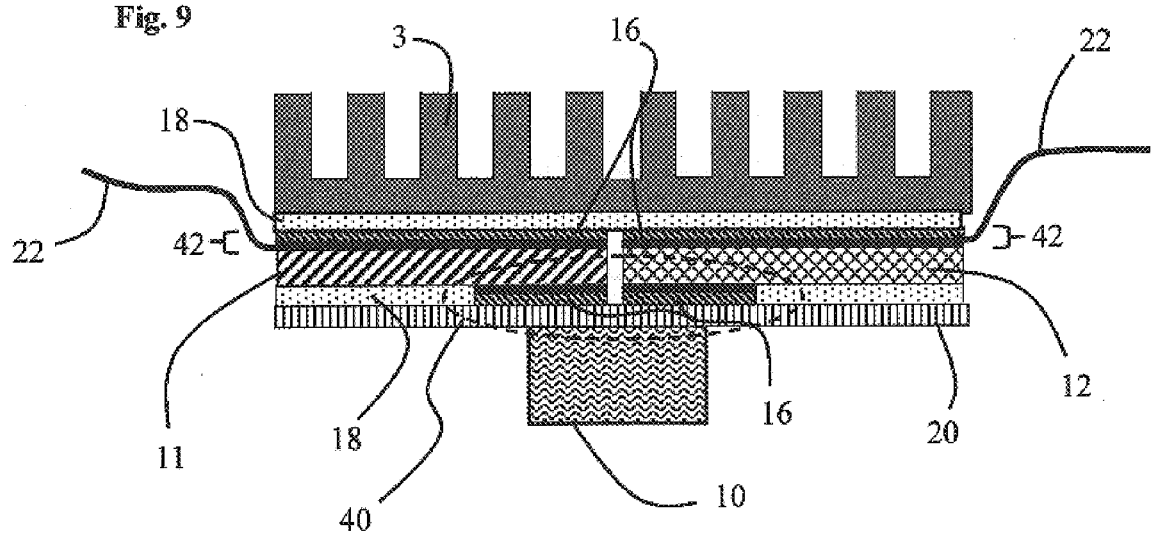
FIG. 9 is a sectional view illustrating a heat sink/spreader structure comprising an electrically powered thermoelectric couple dielectrically coupled to a heat sink.

Reference is now made to FIG. 9 wherein a thermoelectric couple is created without the heat sink 3. The Silicon thermoelement 12, of previous embodiments, is now combined with another dissimilar conductor or semiconductor thermoelement 11 to create the thermoelectric couple. The heat absorbing junction 40 is again created through the bonding of thermoelements 11, 12 to the metallic sheet 20 via the electrically conductive bonding layer 16. The heat rejecting junctions 42 are now the product of the thermoelements 11, 12 contacting the electrically conductive bonding layer 16 adjacent the heat sink 3. The heat sink 3 is electrically isolated from the thermoelectric couple via a dielectric layer 18. The use of two dissimilar semiconducting thermoelements 11, 12 create a higher thermoelectric power and thus, increased heat transfer capability.

Figure 10:
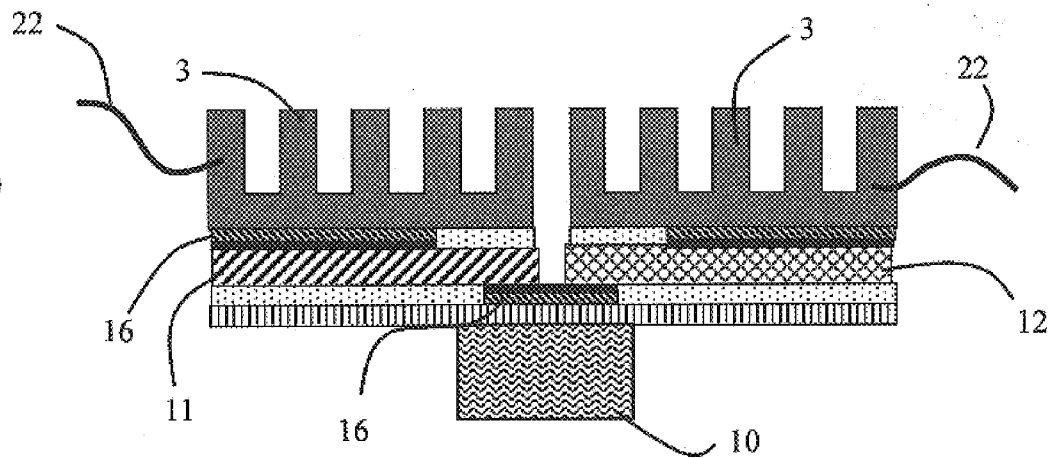
FIG. 10 illustrates a heat sink/spreader structure, differing from FIG. 9 in that an electrically powered thermoelectric couple is electrically coupled to two heat sinks, both of which are part of the electrical circuit with the thermoelectric couple.

FIG. 10 depicts a similar heat sink/spreader structure seen in FIG. 9. However, two heat sinks 3 are introduced and each is electrically bonded to a thermoelement 11, 12 via the electrically conductive bonding layers 16 comprising junctions. The voltage 22 applied, therefore, passes through the components, all of which are in an electrical series.

Figure 11:
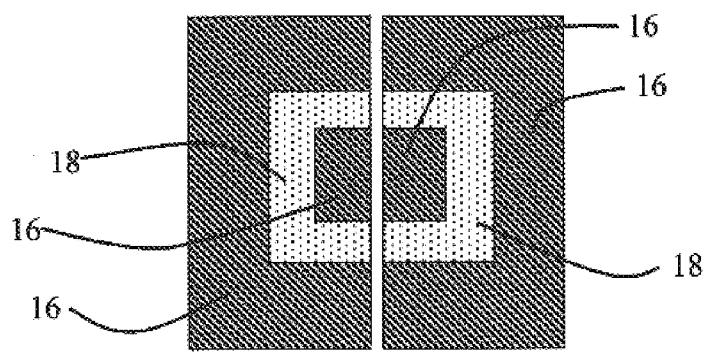
FIG. 11 is a plan view illustrating the electric and dielectric bonding interfaces depicted in FIG. 10.

It can be seen in FIG. 11 how the selective conductive 16 and dielectric 18 bond regions are formed for the embodiment of FIGS. 9 and 10. The design is similar to FIGS. 5a through 5c, however, this embodiment is composed of two parts, corresponding to each thermoelement 11,12 comprising the thermoelectric couple.

Figure 12:
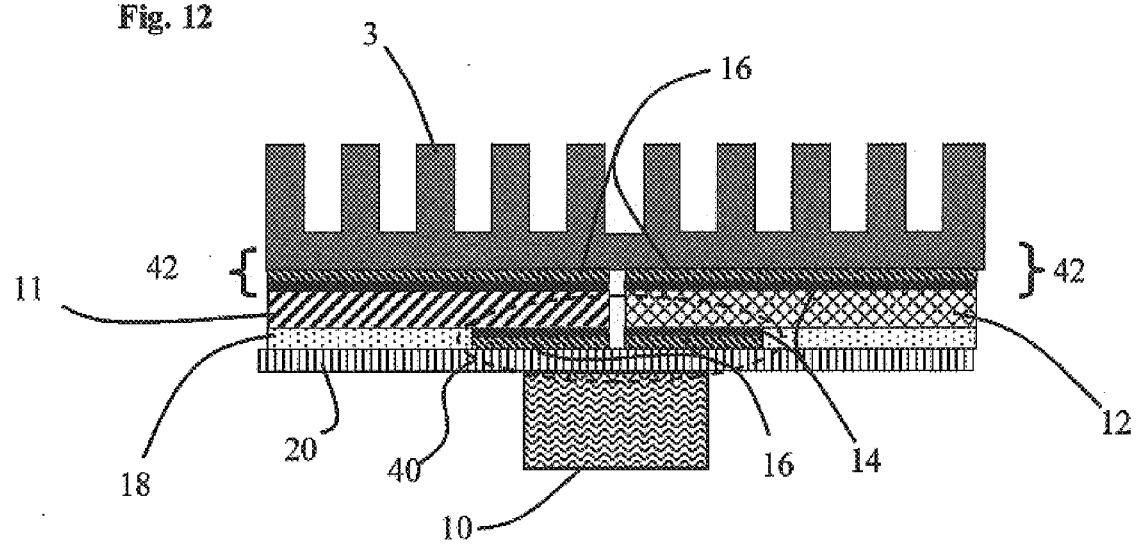
FIG. 12 is a sectional view illustrating a closed circuit thermoelectric couple as one embodiment of the present invention.

The embodiment in FIG. 12 illustrates a thermoelectric couple, similar to FIGS. 9 and 10, in which an external voltage is not applied. The heat rejecting junctions 42 of both thermoelements 11, 12 are electrically connected together, thus creating a closed circuit thermoelectric couple.

According to the Seebeck Effect, if two dissimilar conductors are electrically joined to form two junctions, and if the temperature of each junction differs, a voltage and corresponding current will be developed. Illustrated in FIG. 12, the heat source 10 will induce a temperature differential between the heat absorbing junction 40 and the heat rejecting junctions 42. The actual electric "load" is the heat sink 3 which is electrically connected to each thermoelement 11, 12 to complete the closed circuit. The resulting electric current generated will absorb heat via The Peltier effect from the heat source 10 and transport it to the heat sink 3 utilizing the heat energy in lieu of an external power source.

In one method of fabrication, the thermoelectric couple, comprising two thermoelements, is molded in with the heat sink during it's fabrication, when the heat sink is cast or injection molded.

As seen in FIG. 13, the thermoelectric structure 25 of a heat sink/spreader, comprising thermoelectric couples electrically in series, is illustrated. Dissimilar thermoelements (at least one semiconducting) 11, 12, arranged in a side-by-side radial configuration, are electrically connected to create heat absorbing junctions 16 (located near the center of the structure 25) and heat rejecting junctions 17 (located near the perimeter). A voltage 22 is applied which induces entropy of transport from the center region to the perimeter region of the structure 25.

Seen in the sectional view of FIG. 14, the thermoelectric structure 25 of FIG. 13 is now bonded to its respective heat sink 3 (via a dielectric layer 18) and coupled to a heat source 10. Additionally, the heat absorbing junctions 16 (located near the center of the structure 25) and heat rejecting junctions 17 (located near the perimeter of the structure 25) can be embedded into the thermoelements 11, 12 by a thinning process, creating a planar surface which can better accommodate a physically larger heat source 10.

Reference is now made to FIGS. 15a through 15e, wherein the design and fabrication of another heat sink/spreader embodiment is illustrated.

Figure 15A:
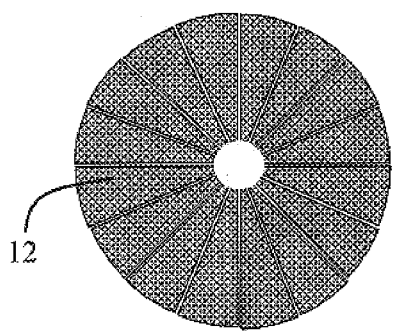
FIGS. 15a through 15e illustrate the fabrication of another heat sink/spreader structure comprising multiple thermoelectric couples and a heat sink.
Figure 15B:
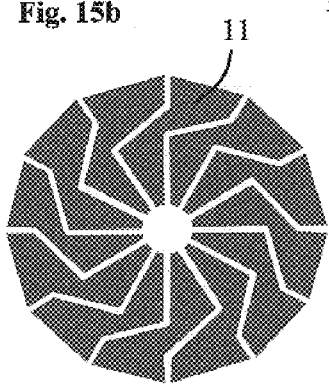

Within FIG. 15a and 15b, dissimilar thermoelement materials 11 (top) 12 (bottom) are provided with their respective final patterns. The thermoelements 11, 12 can consist of: both semiconductors, one semiconductor and one metallic thermoelement or both metallic thermoelements.

Figure 15D:
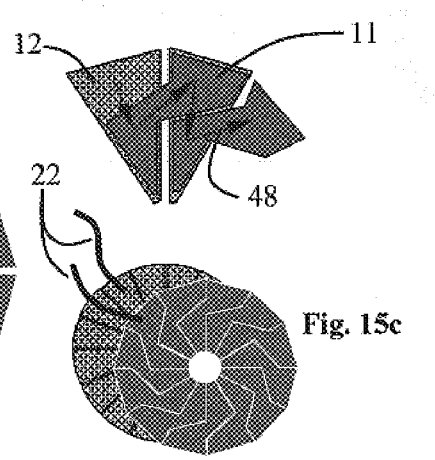
Figure 15C:
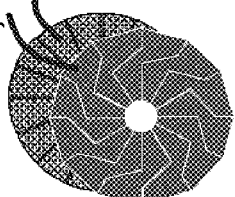

The plan view of FIG. 15c illustrates how the patterned thermoelements 11, 12 are bonded together at plurality of electrically conductive junctions to yield connected thermoelectric couples electrically in series. These junctions comprise the heat absorbing junctions (located approximately near the center of the thermoelement sheet) and heat rejecting junctions which are located approximately near the edge of the thermoelement sheet.

FIG. 15d depicts the electric current flow path 48 through each thermoelement 11, 12 of the two thermoelectric couples disclosed.

Fabrication begins by providing thermoelement materials 11, 12 in a sheet or wafer form. If the materials are of a semiconducting composition, at least one face of each is selectively metallized to accept an electrically conductive bonding layer 16. Now both thermoelement materials are selectively bonded together at the electrically conductive bonding layers 16 which are sandwiched between the top and bottom thermoelements 11, 12. The electrically conductive contact layers 16 comprise two separate portions (two junctions for each thermoelement), each separated by a gap and each bonded to the top and bottom thermoelements 11, 12. Metallization and electrical bonding techniques include: plasma or flame spraying, electroless or electroplating, thermal evaporation, sputtering, welding, brazing, soldering, diffusion bonding or the use of conductive adhesives. A dielectric layer 18 is added to improve thermal conduction through the entire structure.

The composite structure 43 is then masked and subjected to a process to selectively remove regions on both thermoelement materials 11, 12. These removal processes include: chemical etching, laser ablation or water jet removal.

Figure 15E:
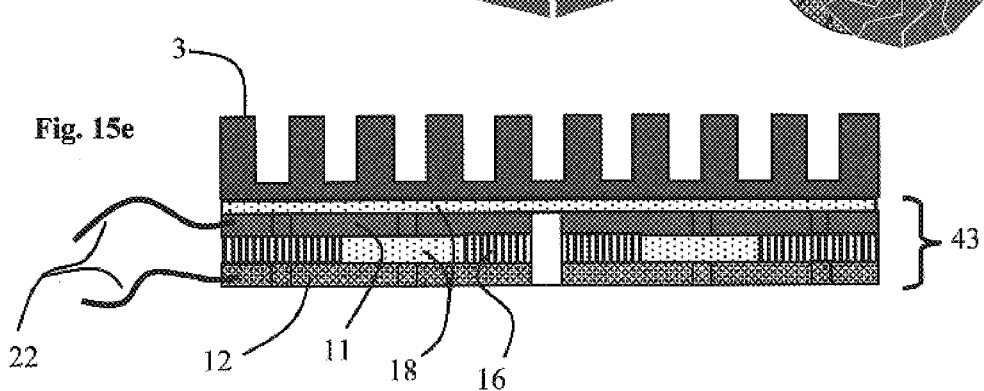

The completed heat sink/spreader structure, including a heat sink 3 bonded via a dielectric layer 18 and subjected to a voltage 22 (when deployed), is illustrated in FIG. 15e.

As shown in FIG. 16, a plan view of a multistage thermoelectric device is illustrated. Each stage 52, 54, 56 is similar in construction to the composite structure 43 of FIGS. 15a through 15e with the exception of a dielectric layer 18 between each thermoelement 11, 12. Each stage includes more than one thermoelement couple, each comprising dissimilar thermoelements 11, 12. The multistage thermoelectric device disclosed can consist of any quantity of stages. Each successive stage is positioned outside the entire perimeter of the previous stage and each stage is larger in thermal capacity than the previous stage.

FIG. 17, an isometric view, depicts a portion of the multistage thermoelectric device seen in FIG. 16. Again, similar to the architecture found in FIG. 15, one type of thermoelement 12 overlaps and is electrically bonded to a dissimilar thermoelement 11, creating an electrical series within each stage 52, 54, 56. A thermally conductive "ring" 21 spans the physical gap between each stage 52, 54, 56 in order to transport heat energy from one stage to the next.

The sectional views of FIGS. 18a through 19e disclose the design and method of fabricating the multistage thermoelectric device seen in FIGS. 15 and 16. The center hole 45 is also shown for clarity.

Fabrication, similar to the structure in FIGS. 15a through 15e begins by providing a thermoelement material 12 in a sheet or wafer form seen in FIG. 18a. If the material is of a semiconducting composition, at least one face is selectively metallized to accept an electrically conductive bonding layer 16 in FIG. 18b.

Within FIG. 18c, a second thermoelement material 11 is selectively bonded to the first thermoelement material 12 at the electrically conductive bonding layers 16. Metallization and electrical bonding techniques include: plasma or flame spraying, electroless or electroplating, thermal evaporation, sputtering, welding, brazing, soldering, diffusion bonding or the use of conductive adhesives. In this embodiment, an air gap is created between each conductive bonding layer 16 in order to decrease thermal conduction of each stage 52, 52 and 56.

A thermally conductive material sheet 21, seen in FIG. 18d, is dielectrically bonded 18 to at least one face of the bonded thermoelement sheets. Optimally, the thermally conductive material sheet 21 is metallic such as Copper or Aluminum.

Both faces of the composite structure 46 are then selectively masked and subjected to a process to selectively remove regions on both thermoelement materials 11, 12 and the thermally conductive material sheet 21. These removal processes include: chemical etching, laser ablation or water jet removal.

The resultant multistage thermoelectric structure can now be seen in FIG. 18e. The heat source is placed in the region 71 (thermally perpendicular to each stage) above heat absorbing junction 40 of the first stage 52. When a voltage is applied to the structure, heat energy is absorbed at the first stage heat absorbing junction 40 and passed through each stage 52, 54, 56 and their respective thermally conductive rings 21 until the heat rejecting junction 42 of the final stage 56 is reached. A heat sink or heat exchanger is placed in the region 72 above the heat rejecting junction 42 to remove the thermal energy.

Figure 19:
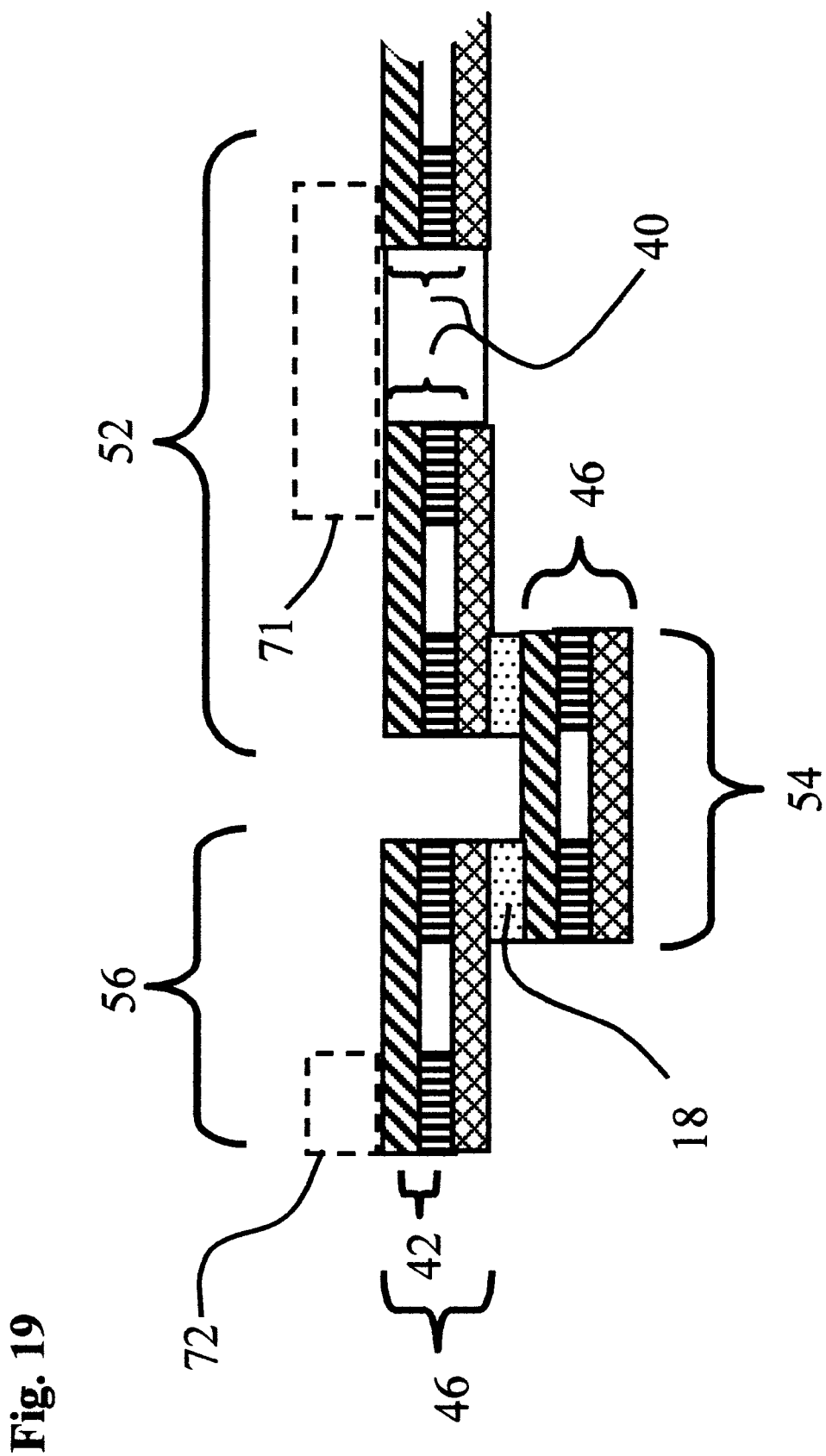
FIG. 19 is also a sectional view of another embodiment of the multistage structure seen in FIGS. 16 through 18.

FIG. 19 illustrates another multistage thermoelectric structure embodiment in which the stages 52, 54, 56 alternate between two different planes. This embodiment is fabricated similarly to the structure seen in FIGS. 16 through 18, however, one composite structure 46 is dielectrically bonded to similar second composite structure 46 in lieu of the thermally conductive sheet or "ring" 21. The heat absorbing junctions 40 of each successive stage overlap the previous stage's heat rejecting junctions 42. Additionally, a heat source is placed in the region 71 directly above the heat absorbing junction 40 of the first stage 52 and a heat sink is located in the region 72 directly above the heat rejecting junction of the final stage 56.

Figure 20:
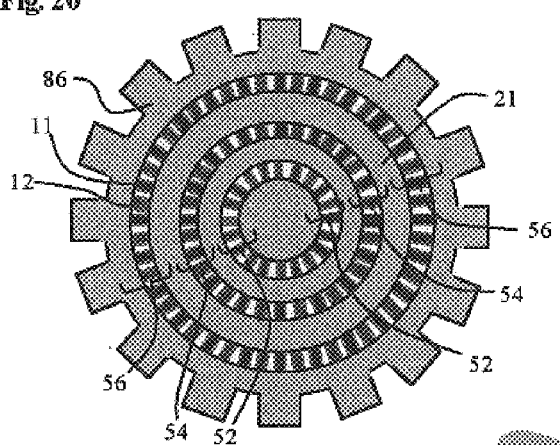
FIG. 20 is a plan view, similar to FIG. 16, illustrating another embodiment of a multistage thermoelectric device.

Within FIG. 20, one embodiment of a multistage thermoelectric device is illustrated. Again, as in FIG. 16, each stage 52, 54, 56 is similar in construction. However, the dissimilar thermoelements 11, 12 are located along side each other, therefore, in the same plane. Thermal energy is transferred from stage to stage via a thermally conductive sheet material 21, in the final form of a ring or loop, placed across the heat rejecting interconnection members of the previous stage and the heat absorbing interconnection members of the successive stage. Also shown, the outermost loop of thermally conductive material 86, located above the heat rejecting interconnection members of the final stage, is formed with heat sink fins in order to dissipate the excess heat energy to the surroundings.

FIGS. 21a through 21d depict the design and method of fabricating the multistage device seen in FIG. 20.

Figure 21A:
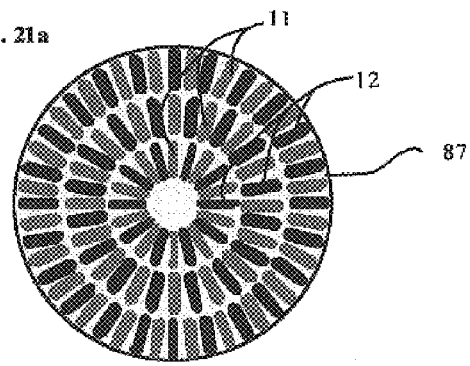
FIGS. 21a through 21d illustrate the fabrication of the multistage thermoelectric device seen in FIG. 20.

FIG. 21a illustrates a circular wafer 87 composed of a metallic material into which groups or "rings" of cavities, or thru holes, are formed. Each ring of cavities corresponds to a thermoelectric device stage. Each stage consists of alternately placed dissimilar thermoelements 11, 12. After the thermoelement material, in particulate form, is dispensed into the cavities, the entire wafer is subjected to heat with or without simultaneous pressure applied to the thermoelement faces. The "sintering" of these particles yields solid thermoelements 11, 12.

Portions of the exposed faces of each thermoelement 11,12 (on both faces of the wafer) are next metallized. Depending on the thermoelement material utilized, a metallic diffusion barrier layer is first selectively deposited onto the thermoelements 11, 12. In order to create the electrically connecting interconnection members 85, the techniques utilized to deposit the diffuision barrier layer, such as electroless or electroplating, are employed similarly. Additionally, the interconnection members 85 can be created by an electrically bonding metallic sheet material to the surfaces of the thermoelements. In either technique to create the interconnection members 85, the metallic layers can be first deposited over the entire surface and selectively removed, or selectively deposited with the aid of masks or pre-fabricated metallic sheets.

After the interconnection members 85, spanning each dissimilar thermoelement 11, 12 (electrically and physically parallel on both the top and bottom face) have been formed, the wafer material 87 is removed via chemical etching. The resultant structure, illustrating three stages 52, 54, 56, can be seen in FIG. 21b.

Figure 21B:
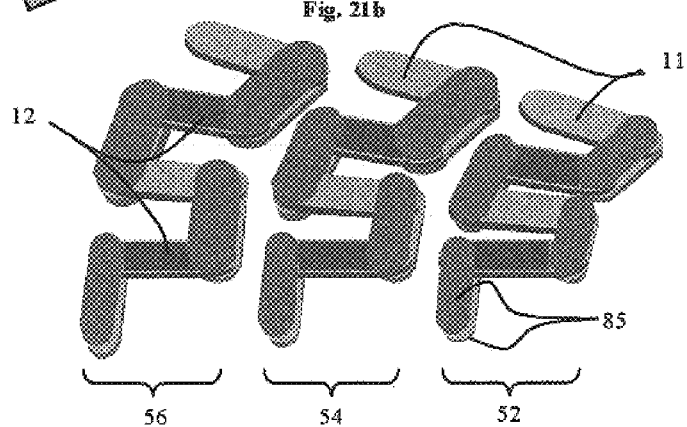
Figure 21C:
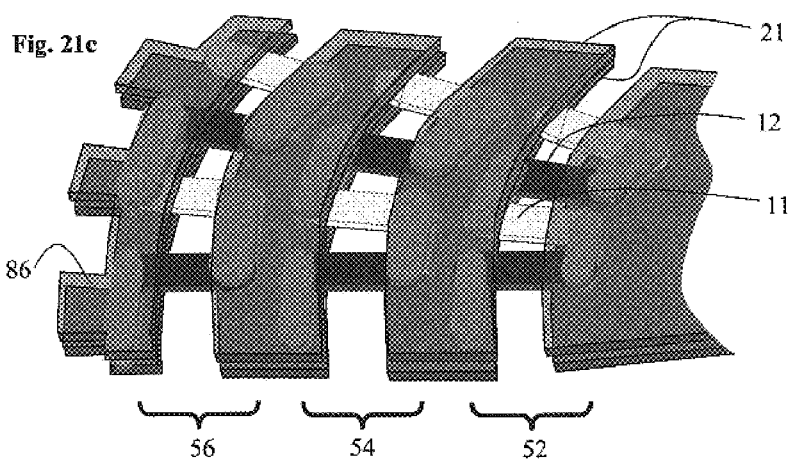

Next, FIG. 21c depicts the structure of FIG. 21b with thermally conductive sheet material 21 bonded to the heat rejecting interconnection members from one stage to the heat absorbing interconnection members of the next successive stage. This thermally conductive sheet 21, dielectrically bonded 18 to each stage's interconnection members, passes the pumped heat energy from the heat source, through each stage to the heat rejecting interconnection members 42 on the final stage 56. The final thermally conductive sheet 86 contains formed fins, which facilitate heat dissipation to the surroundings. An external heat sink can also be bonded to the conductive sheet 86 to add in dissipation capacity.

Figure 21D:
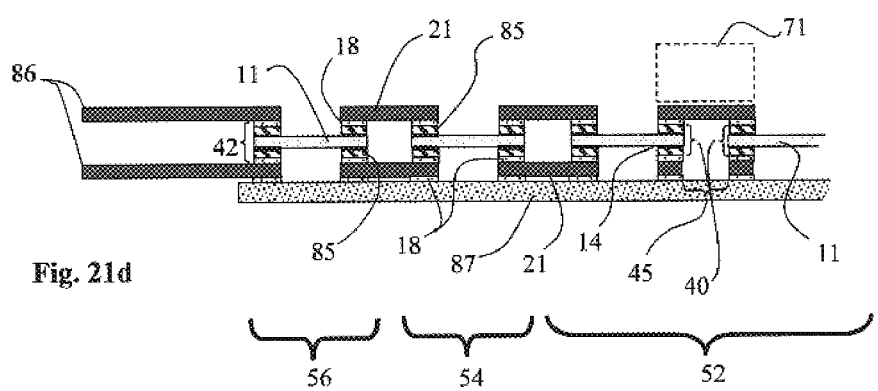

A sectional view of the structure, bonded to a rigid substrate 87 (of poor thermal conductivity), can be seen in FIG. 21d. The heat source region 71 is located adjacent to the heat absorbing junctions 40 of the first stage 52 and the center hole 45 of the structure. Additionally, a second rigid substrate can be applied to the exposed side of the multistage structure via thermally conductive sheet material 21. Next, the perimeter region between each substrate can be hermetically sealed with a polymeric compound to prohibit moisture entry. Thermal performance can be enhanced by evacuating this inner region which will reduce heat transfer (through the air space) from the heat absorbing junctions of the first stage to the heat rejecting junctions of the final stage.

Figure 22:
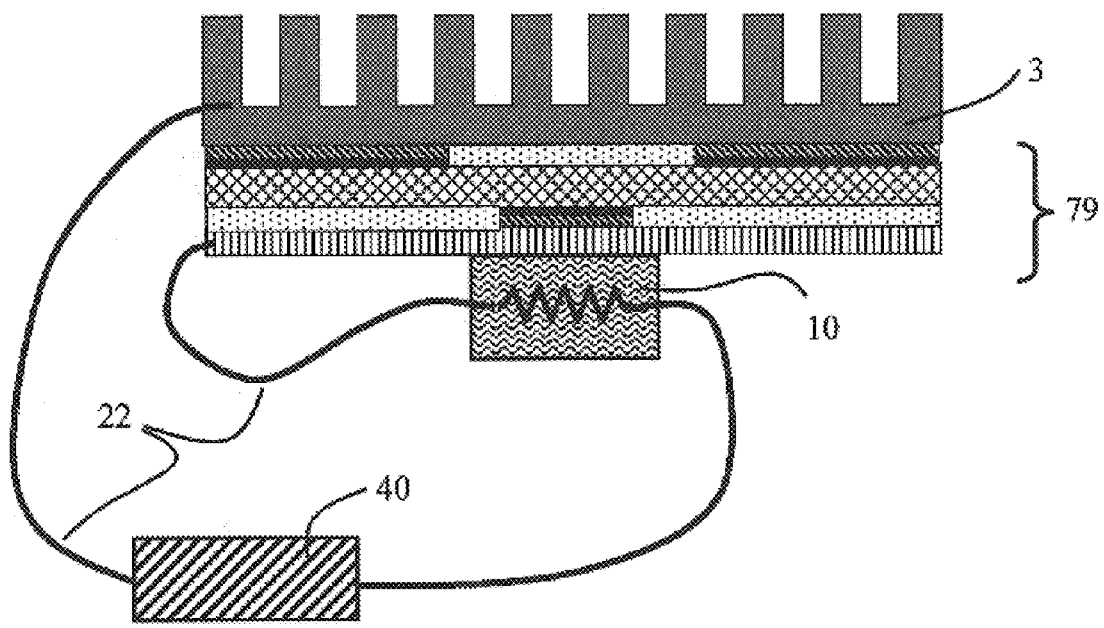
FIG. 22 illustrates how the heat sink/spreader of the present invention is electrically in series with an external electrical load.

As seen in FIG. 22, one heat sink/spreader embodiment of the present invention is depicted comprising a thermoelectric composite structure 79 and a heat sink 3 coupled to a heat source 10. The electric potential (voltage) 22 applied across the thermoelectric couple, comprising the heat sink/spreader structure, is also applied across an external electrical load, such as the heat source 10. The heat sink/spreader structure is, therefore, electrically in series with an electrical load other than itself, when connected to an electrical power supply 40. The external load can be an integrated circuit or other electronic component, possibly the heat source for the heat sink/spreader structure. In this way, the electrical current draw by both the heat source and heat sink/spreader will be interconnected. As the heat source demands more current, more heat must be removed and thus, the heat sink sink/spreader (electrically in series) will also receive additional current, which will increase heat transport capacity. Additionally, a series configuration allows the heat sink/spreader to operate at any voltage level typically used by direct current electronic components. Any embodiment of the present invention (heat sink, thermoelement couple or the like) may be connected electrically in series with an electrical load other than itself, such as the embodiment illustrated here in FIG. 22.

Figure 23:
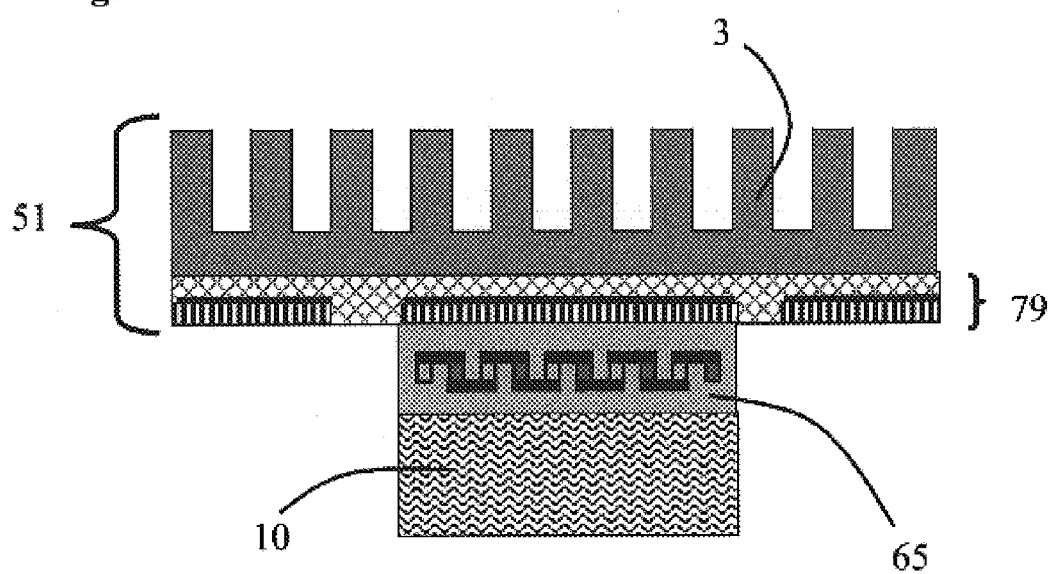
FIG. 23 illustrates the combination of the heat sink/spreader structure of the present invention and a conventional thermoelectric cooler or generator of the prior art.

FIG. 23 illustrates one heat sink/spreader structure embodiment 51 dielectrically bonded to a typical thermoelectric cooler or generator 65, which in turn, is coupled to a heat source 10. This external thermoelectric device 65 can also be bonded between the composite structure 79 and the heat sink 3. The typical thermoelectric device transports thermal energy in a compact fashion, similarly to the high heat density of many electronic components. Therefore, the thermoelectric device 65 requires an efficient heat sink/spreader structure to remove heat, not unlike that of the heat source 10.

Figure 24:
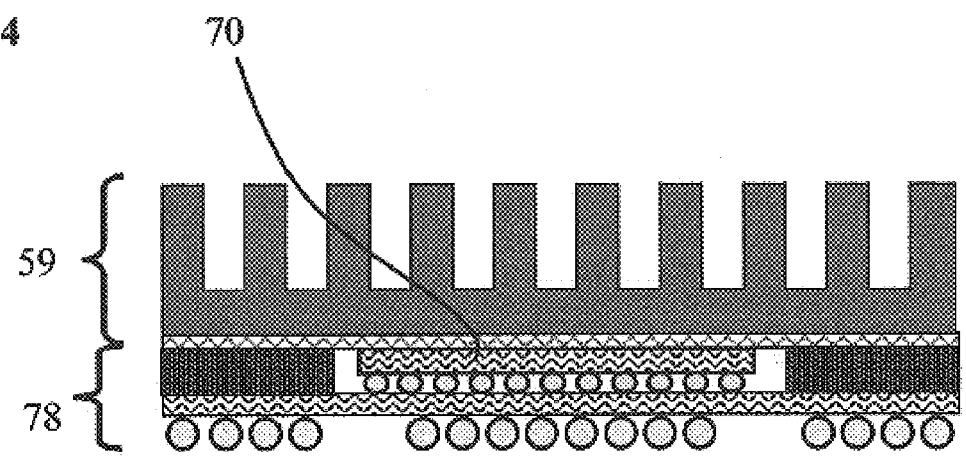
FIG. 24 depicts the integration of the heat sink/spreader of the present invention with an integrated circuit package.

One application of the present invention can be seen in FIG. 24. A Ball Grid Array (BGA) package 78 containing a Flip Chip die 70 is illustrated which now includes one heat sink/spreader structure embodiment 59 of the present invention. A BGA is an integrated circuit package scheme featuring a multiplicity of solder ball electrical terminals arranged in a prescribed array. Within the BGA package cavity, the signal lines of the integrated circuit chip, or die, are bonded to the package for subsequent connection to the circuit board. One such chip type and mounting method, a Flip Chip, is inverted to facilitate direct bonding of its signal pads to those of the BGA package. The structure 59 is attached to the top of the package (or chip) in order to efficiently remove heat energy from the small Flip Chip die 70 through a combination of passive thermal conduction and entropy of transport, via the thermoelectric effects.

Figure 25:
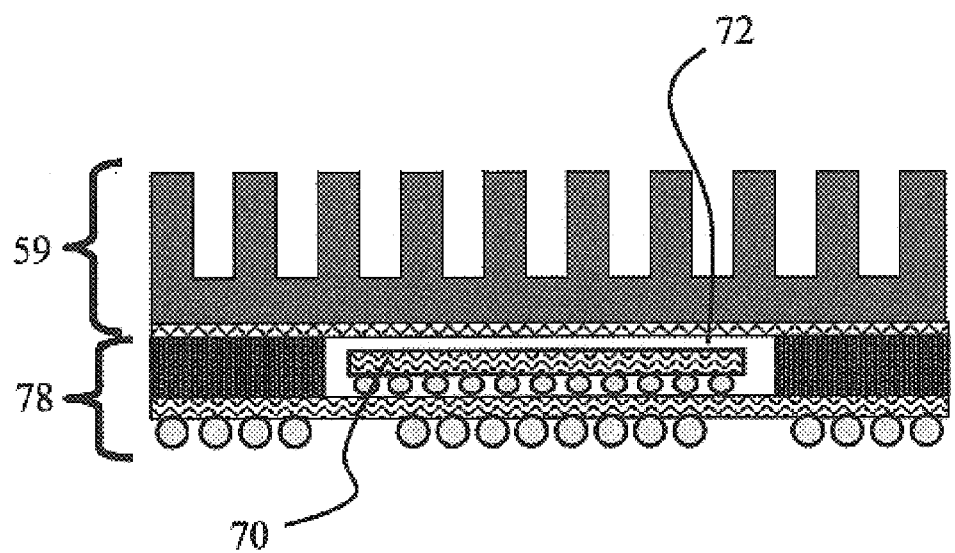
FIG. 25 depicts one embodiment of the integration of the heat sink/spreader (of the present invention) and an integrated circuit package.

Another embodiment of the application (seen in FIG. 24) is depicted in FIG. 25. An air barrier 72 is provided between the Flip Chip die 70 and the heat sink/spreader structure 59 to mitigate any thermal expansion mismatching between the die 70 and structure 59. Thermal energy is transported across the air barrier 72 via radiative conduction.

Figure 26:
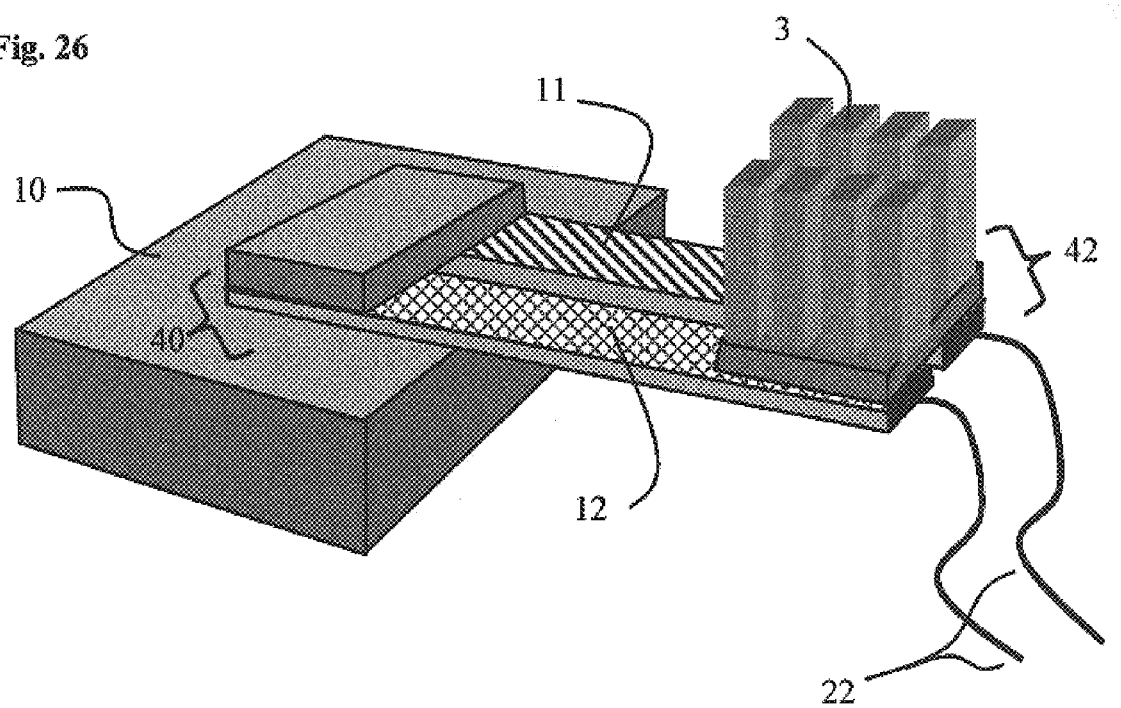
FIG. 26 illustrates a heat sink/spreader of the present invention in which the heat sink is located remotely from the heat source and perpendicularly placed thermoelectric couples transport thermal energy.

FIG. 26 illustrates a further embodiment of the heat sink/spreader structure invention. This embodiment depicts a thermoelectric couple comprised of two dissimilar thermoelements 11, 12 with a heat absorbing junction 40 coupled to a heat source 10 and heat rejecting junctions 42 coupled to a remotely located heat sink 3. A voltage applied 22 across the thermoelectric couple transports thermal energy, via thermal conduction and entropy of transport, through lo thermoelement legs 11, 12, which are perpendicular to the heat source 10 and heat sink 3. This embodiment accommodates heat sources unable to utilize a "local" heat sink, due to physical constraints or the need to remove heat from a sealed enclosure, such as a laptop computer.

Several embodiments of the present invention have been described. A person skilled in the art, however, will recognize that many other embodiments are possible within the scope of the claimed invention. For this reason, the scope of the invention is not to be determined from the description of the embodiments, but must instead be determined solely from the claims that follow.

What is claimed is:

1. A thermoelectric heat spreader attachable to a heat sink, the spreader comprising:
    a top thermoelement that can be bonded to the heat sink; and a bottom thermoelement bonded to the top thermoelement at a plurality of spaced electrically conducting junctions, wherein the top thermoelement is made of a different material than the bottom thermoelement, and wherein the top and bottom thermoelements together form a thermoelectric couple.

2. The spreader of claim 1 wherein the top thermoelement is a semiconductor and the bottom thermoelement is a conductor.

3. The spreader of claim 1 wherein each thermoelement is made of semiconducting material.

4. The spreader of claim 1 further comprising a electrically conductive contact layer sandwiched between the top and bottom thermoelements and bonded thereto at a plurality of spaced electrically conducting junctions, wherein each thermoelement is of a different material than the thermoelement to which it is bonded.

5. The spreader of claim 4 wherein a portion of the top thermoelement is a conducting or semiconducting material and another portion is a dielectric material, wherein a portion of the bottom thermoelement is a conducting or semiconducting material and another portion is a dielectric material, and wherein the electrically conductive contact layer is a conductor or semiconductor.

6. The spreader of claim 4 wherein the electrically conductive contact layer comprises a plurality of layers bonded to each other along electrically conductive junctions.

7. The spreader of claim 4 wherein the electrically conductive contact layer comprises two separate portions, wherein the separate portions are separated by a gap and each is bonded to the top and bottom layers along electrically conductive junctions.

8. The spreader of claim 1 wherein the thermoelements comprise sheets and the junctions comprise a heat absorbing junction and a heat rejecting junction, wherein the heat absorbing junction is located approximately near the center of each thermoelement sheet and the heat rejecting junction is located approximately near the edge of the sheets.

9. The spreader of claim 1 further comprising an external thermoelectric device dielectrically bonded to the top thermoelement or the heat sink.

10. The spreader of claim 1 wherein the spreader is electrically in series with an electrical load other than itself.

11. The spreader of claim 10 wherein the electrical load is an integrated circuit or other electronic component.

12. The spreader of claim 1 wherein the spreader is attached to the package of an electronic component.

13. A thermoelectric heat spreader to which an electrical potential is applied, the spreader comprising:
    a heat sink;
    a top thermoelement bonded to the heat sink; and
    a bottom thermoelement bonded to the top thermoelement at a plurality of spaced electrically conducting junctions, wherein the top thermoelement is made of a different material than the bottom thermoelement, and wherein the top and bottom thermoelements together form a thermoelectric couple.

14. The spreader of claim 13 wherein the top thermoelement is a semiconductor and the bottom thermoelement is a conductor.

15. The spreader of claim 13 wherein both thermoelements are made of semiconducting material.

16. The spreader of claim 13 further comprising a electrically conductive contact layer sandwiched between the top and bottom thermoelements and bonded thereto at a plurality of spaced electrically conducting junctions, wherein each thermoelement is of a different material than the thermoelement to which it is bonded.

17. The spreader of claim 16 wherein a portion of the top thermoelement is a conducting or semiconducting material and another portion is a dielectric material, wherein a portion of the bottom thermoelement is a conducting or semiconducting material and another portion is a dielectric material, and wherein the electrically conductive contact layer is a conductor or semiconductor.

18. The spreader of claim 16 wherein the electrically conductive contact layer comprises a plurality of layers bonded to each other along electrically conductive junctions.

19. The spreader of claim 16 wherein the electrically conductive contact layer comprises two separate portions, wherein the separate portions are separated by a gap and each is bonded to the top and bottom layers along electrically conductive junctions.

20. The spreader of claim 13 wherein the thermoelements comprise sheets and the junctions comprise a heat absorbing junction and a heat rejecting junction, wherein the heat absorbing junction is located approximately near the center of each thermoelement sheet and the heat rejecting junction is located approximately near an edge of the sheets.

21. The spreader of claim 13 further comprising an external thermoelectric device dielectrically bonded to the top thermoelement or the heat sink.

22. The spreader of claim 13 wherein the spreader is electrically in series with an electrical load other than itself.

23. The spreader of claim 22 wherein the electrical load is an integrated circuit or other electronic component.

24. The spreader of claim 13 wherein the spreader is attached to the package of an electronic component.

25. A heat sink for dissipating heat from a heat source, the heat sink comprising:
    a heat sink attachable to the heat source; and
    an electrical source connected to the heat sink to cause a current to flow through the heat sink, whereby the current flowing through the heat sink increases the heat dissipated by the heat sink.

26. A heat sink/spreader structure comprising:
    a heat sink; and
    a thermoelement couple, with an electric potential applied across the thermoelement couple, wherein the thermoelement couple is electrically in series with an electrical load.

27. A heat sink/spreader structure comprising:
    an electrically conductive heat sink; and
    a dissimilar thermoelement electrically bonded to the heat sink forming a thermoelectric couple wherein the dissimilar thermoelement material comprises a plurality of conducting or semiconducting layers separated by dielectric layers.

* * * * *